United States Patent [19]
Bischoff

[11] Patent Number: 5,173,826
[45] Date of Patent: Dec. 22, 1992

[54] THIN FILM HEAD WITH COILS OF VARYING THICKNESS
[75] Inventor: Peter G. Bischoff, Cupertino, Calif.
[73] Assignee: Read-Rite Corp., Milpitas, Calif.
[21] Appl. No.: 709,333
[22] Filed: Jun. 3, 1991
[51] Int. Cl.[5] .............................................. G11B 5/147
[52] U.S. Cl. ...................................... 360/126; 360/123
[58] Field of Search ................ 360/126, 119, 122, 123, 360/125

[56] References Cited
U.S. PATENT DOCUMENTS

| | | | |
|---|---|---|---|
| 3,987,488 | 10/1976 | Kanai et al. | 360/123 |
| 4,219,854 | 8/1980 | Church et al. | 360/123 |
| 4,295,173 | 10/1981 | Romankiw et al. | 360/125 |
| 4,375,657 | 3/1983 | Brock et al. | 360/125 |
| 4,639,289 | 1/1987 | Lazzari | 360/123 X |
| 4,685,014 | 8/1987 | Hanazono et al. | 360/126 |
| 4,751,599 | 6/1988 | Katou | 360/126 |
| 4,752,850 | 6/1988 | Yamada et al. | 360/121 |
| 4,760,481 | 7/1988 | Yuito et al. | 360/123 |
| 4,771,350 | 9/1988 | Desserre | 360/123 |
| 4,860,140 | 8/1989 | Momata et al. | 360/126 X |

Primary Examiner—John H. Wolff
Attorney, Agent, or Firm—Nathan N. Kallman

[57] ABSTRACT

A thin film head assembly includes a coil structure having a thin coil layer that extends within and beyond the magnetic yoke area delineated between opposing magnetic pole pieces, and an additional coil layer formed as a step segment adjacent to the thin layer. The additional layer is spaced away from the pole pieces and the magnetic yoke area and provides a thickened coil area which affords a significant reduction in coil resistance.

8 Claims, 8 Drawing Sheets

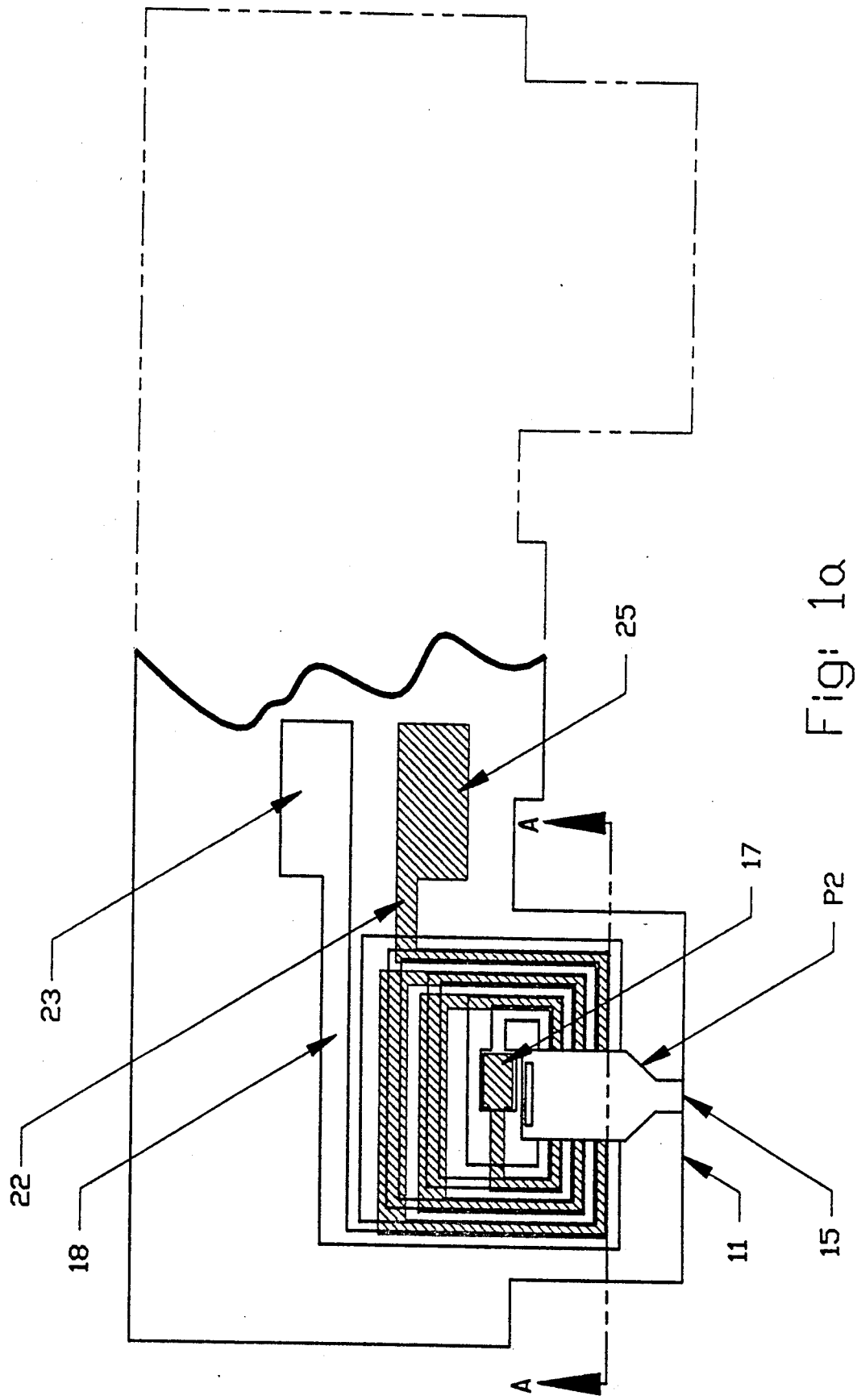

THIN FILM HEAD WITH COILS OF VARYING THICKNESS

FIELD OF THE INVENTION

This invention relates to a method and means of making a thin film magnetic head and in particular to a magnetic head having conducting coils of varying thickness.

BACKGROUND OF THE INVENTION

As is well known in the art, thin film magnetic heads used with data storage apparatus, such as disk files, typically comprise magnetic pole pieces and an electrically conductive coil structure disposed between the pole pieces. The tips of the pole pieces define a transducing gap for coaction with a magnetic medium, such as a magnetic disk that rotates close to the transducing gap of the head. The pole pieces interconnect at a back gap closure. A polished ceramic substrate having a thin insulation layer thereon, which is lapped and polished, supports the different layers which are deposited to form the magnetic transducer. To prevent electrical shorting, insulating layers are provided between the coils and pole pieces.

During operation in the recording mode of a data storage device, such as a disk drive, current representing data signals is directed to the conductive coils. The current is converted to magnetic flux signals by the magnetic head or transducer, and the signals are recorded on the disk as it rotates adjacent to the nonmagnetic transducing gap. During the readout or playback mode, as the magnetic disk is rotated past the head, the recorded magnetic flux signals are sensed and are converted to current that flows through the conductive coils. Bischoff et al. U.S. Pat. No. 4,694,368 which issued on Sep. 15, 1987 describes a process of making a thin film magnetic head or transducer, and is incorporated herein by reference.

A significant problem that is experienced with thin film magnetic heads is the relatively high coil resistance or transducer resistance. The power $I^2R$ (where I is current and R is determined by the value of coil resistance. Thus the higher the resistance) that is dissipated during the recording process is determined by the value of coil resistance. Thus the higher the resistance of the head coil structure, the higher will be the power dissipation and the greater the extent of thermal expansion of the components of the recording head and the recording apparatus. Thermal expansion adversely affects the recording operation. In addition, during the readout mode, the amount of thermal noise that is generated depends upon the level of coil resistance. This thermal noise is generated at the transducer level and will be amplified in the storage apparatus, resulting in an undesirable reduction of the signal-to-noise ratio of the recording process.

An important factor to be considered in the design of a recording head is the number of coil windings or turns which are used. Signal output is directly proportional to the number of turns. As narrower tracks are used on the disk surface, higher track density and higher data density make it necessary to use more coil turns in order to maintain an adequate signal level. If the signal being processed has a low amplitude, data errors may occur during the recording process.

Thin film heads typically have small geometries, when compared to prior art ferrite heads. In order to maintain a high efficiency for the thin film head, coil pitch had to become smaller and smaller, which resulted in an increase in coil resistance. Presently known thin film heads are characterized by an average resistance of about 30 to 40 ohms for a 34 turn head, and 40 to 50 ohms for a 42 turn head, by way of example. On the other hand, ferrite heads have a resistance of 5 to 10 ohms for a 30 turn head. The difference in resistance occurs because the larger ferrite heads are able to use conductive wires or turns with a 25.4 to 50.8 microns diameter, while the cross-section of a thin film head turn is about 3-4 microns.

One approach that has been considered for reducing the overall resistance of a thin film transducer is to make the coils wider. However, wider coils reduce the efficiency of the transducer because the yoke structure would necessarily have to be made too long. Another approach would be to make the entire coil thicker which has its limitations because of constraints that arise with the photoresist process. If the coils are too thick under the magnetic portion of the transducer, subsequent fabrication of the top pole piece becomes more difficult because of the increased step. Also, since there is a large difference in thermal expansion between the insulation material used for insulating the coils and the nickel alloy material used for fabricating the poles or magnetic portion of the transducer, the use of too much insulating material would adversely affect the performance of the recording head.

Another approach to realize lower transducer resistance is to use a different coil material having lower resistance. At present, transducer coils are made of electroplated copper having a resistivity in the range of about 1.8 to 2.2 ohms centimeter. Although silver has a lower resistivity of 1.59 ohms cm., the fabrication of silver coils is so complex that it would outweigh any advantage of a 3% reduction in resistance.

SUMMARY OF THE INVENTION

An object of this invention is to provide a thin film head having a reduced coil resistance without degrading the performance of the magnetic head.

Another object of this invention is to provide a thin film head that affords a relatively high signal output without any complex modification in the head structure or manufacturing process.

According to this invention, a thin film magnetic head comprises pole piece layers P1 and P2 with one or more conductive coils deposited between the pole pieces. The portions of the coil structure under the operating magnetic portion of the transducer between the pole pieces are relatively thin, as is found with conventional thin film heads. However, the thickness of the coil portions outside of the magnetic yoke area are made substantially thicker to effectively reduce the overall electrical resistance of the transducer.

BRIEF DESCRIPTION OF THE DRAWINGS

The invention will be described with reference to the drawing in which:

FIG. 1a is a representational plan view of a prior art thin film head, to aid in the explanation of this invention;

Similar numerals refer to similar elements throughout the drawing.

DETAILED DESCRIPTION OF THE PREFERRED EMBODIMENT

Figure 1B:
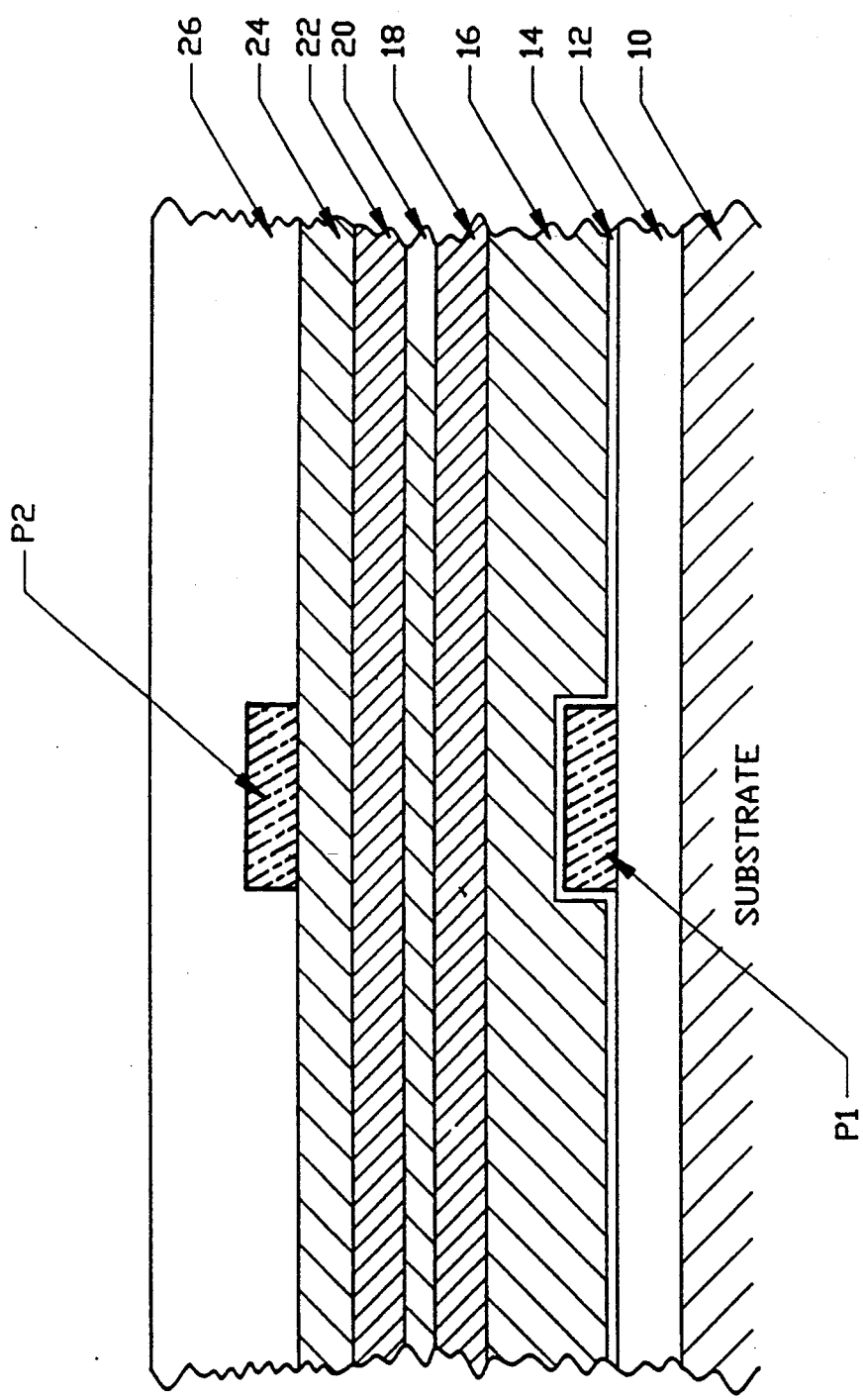
FIG. 1b is a partial lateral cross-sectional view, taken through line A—A of FIG. 1a, of a conventional thin film recording head, depicting planar first and second coils located between the pole pieces.

With reference to FIGS. 1a and 1b, a typical embodiment of a thin film head assembly comprises a ceramic substrate 10 preferably made of a material formed from a mixture of aluminum oxide ($Al_2O_3$) and titanium carbide (TiC). The ceramic substrate 10 is polished to provide a smooth surface on which a layer of insulating aluminum oxide 12 is deposited by r.f. sputtering, for example. The insulating oxide layer 12 is lapped and polished to eliminate surface defects. To form the first pole piece P1, an alloy formed from nickel and iron is deposited by r.f. sputtering over the insulating layer 12. The pattern of the pole piece P1 is formed by means of a mask using standard photolithographic processes. After deposition of the P1 pole piece, a thin film 14 of sputtered aluminum oxide is deposited over the entire surface of the P1 pole piece layer. The portion of the oxide film 14 in the area of the back gap of the transducer is removed by standard masking and etching to produce a transducing gap layer. The thin oxide film 14 which extends to the tips of pole pieces P1 and P2 provides the transducing gap at the transducing surface of the thin film head. The P1 pole piece and second pole piece P2 which is spaced above P1 and in virtual alignment with P1 provide a magnetic field between the pole pieces. The pole pieces are preferably made of a nickel-iron alloy. The insulation layer 16 serves as a smoothing layer that is fabricated after forming the pole piece P1 and provides a substantially planar surface for the deposition of a first coil structure 18 made of a layer of copper material. A second coil structure 22 is deposited over an insulating layer 20 that is formed over the first coil structure 18. The two coil structures 18 and 22 are tied at a connection 17. The electrical coils 18 and 22 which are fabricated between the pole pieces P1 and P2 conduct current within the magnetic field generated by the pole pieces.

During recording of data, signals are directed to the coils 18 and 22 from an external data processing circuit to terminals 23 and 25. The data signals are transduced and converted to magnetic flux signals at the transducing gap 15 formed at the end of gap layer 14 and at the transducing surface of the thin film transducer or head 11. Organic insulation layers 16, 20 and 24 made of baked and hardened photoresist are interweaved between the P1 and P2 pole pieces and the coil structures 18 and 22. An insulating aluminum oxide overcoat layer 26 is r.f. sputtered over the entire thin film head structure to protect against deleterious ambient effects, such as humidity for example.

Figure 2:
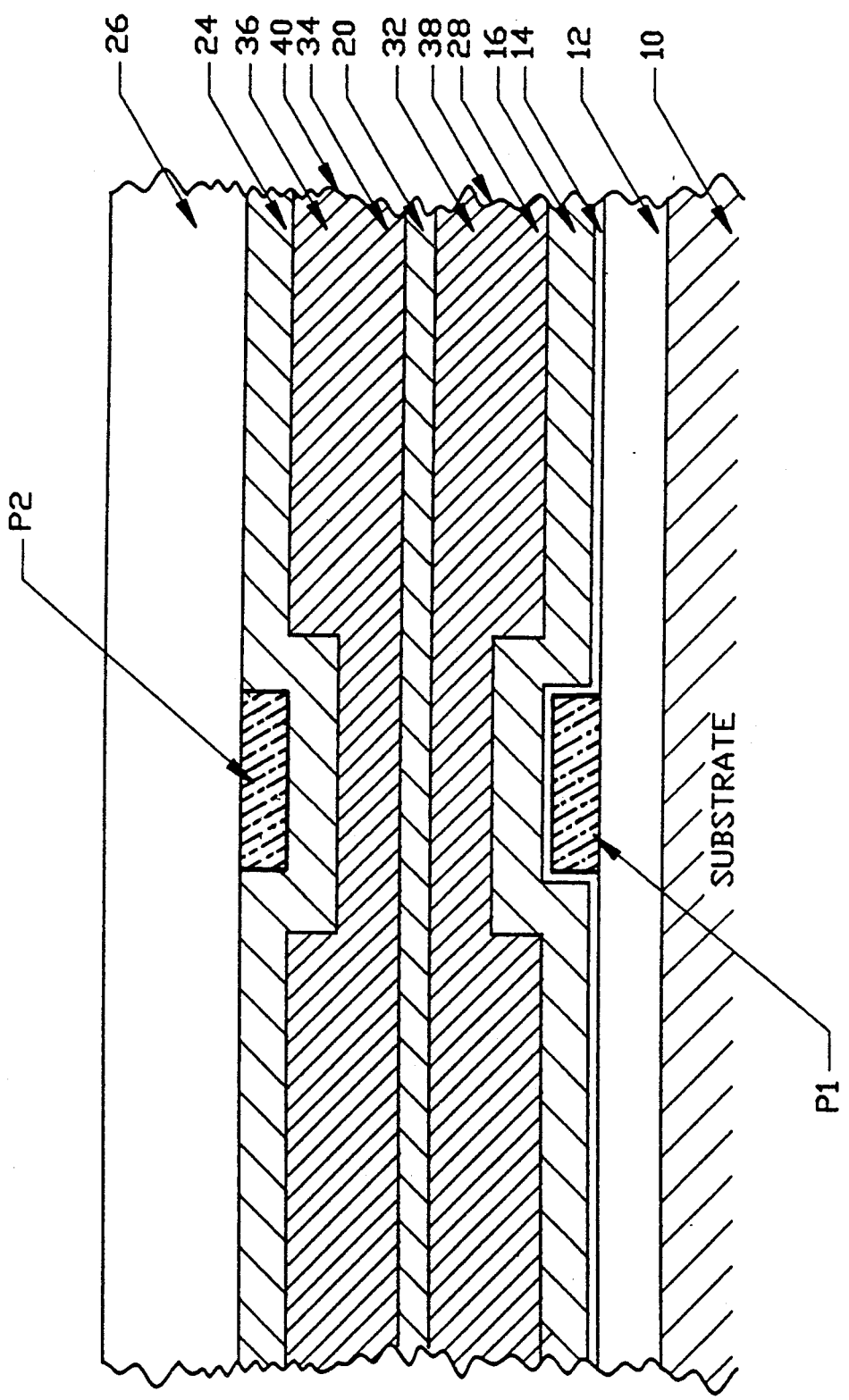
FIG. 2 is a partial cross-sectional view of a thin film head assembly showing an increased coil thickness outside the pole region, in accordance with this invention.
Figure 3:
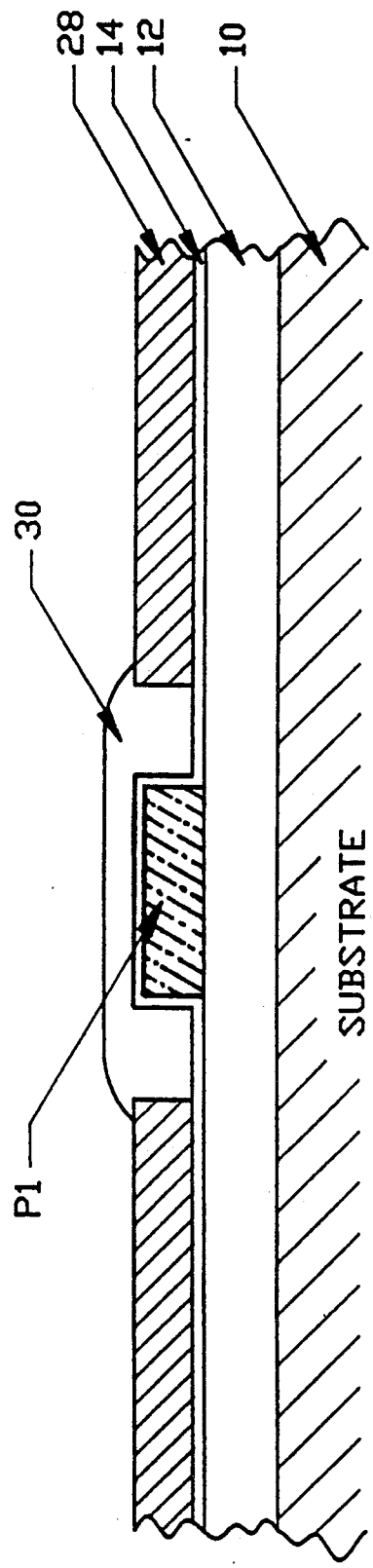
FIG. 3 is a partial cross-sectional view showing the first leg of the first coil structure.
Figure 4:
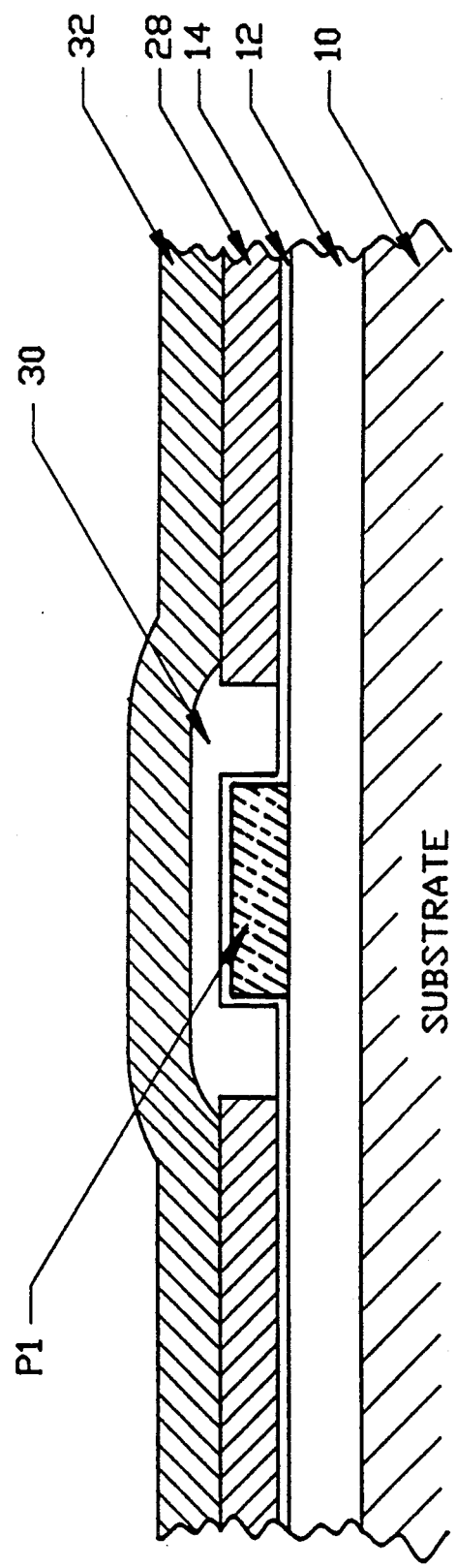
FIG. 4 is a partial cross-sectional view showing the first and second legs of the first coil structure deposited over the P1 pole piece.
Figure 6:
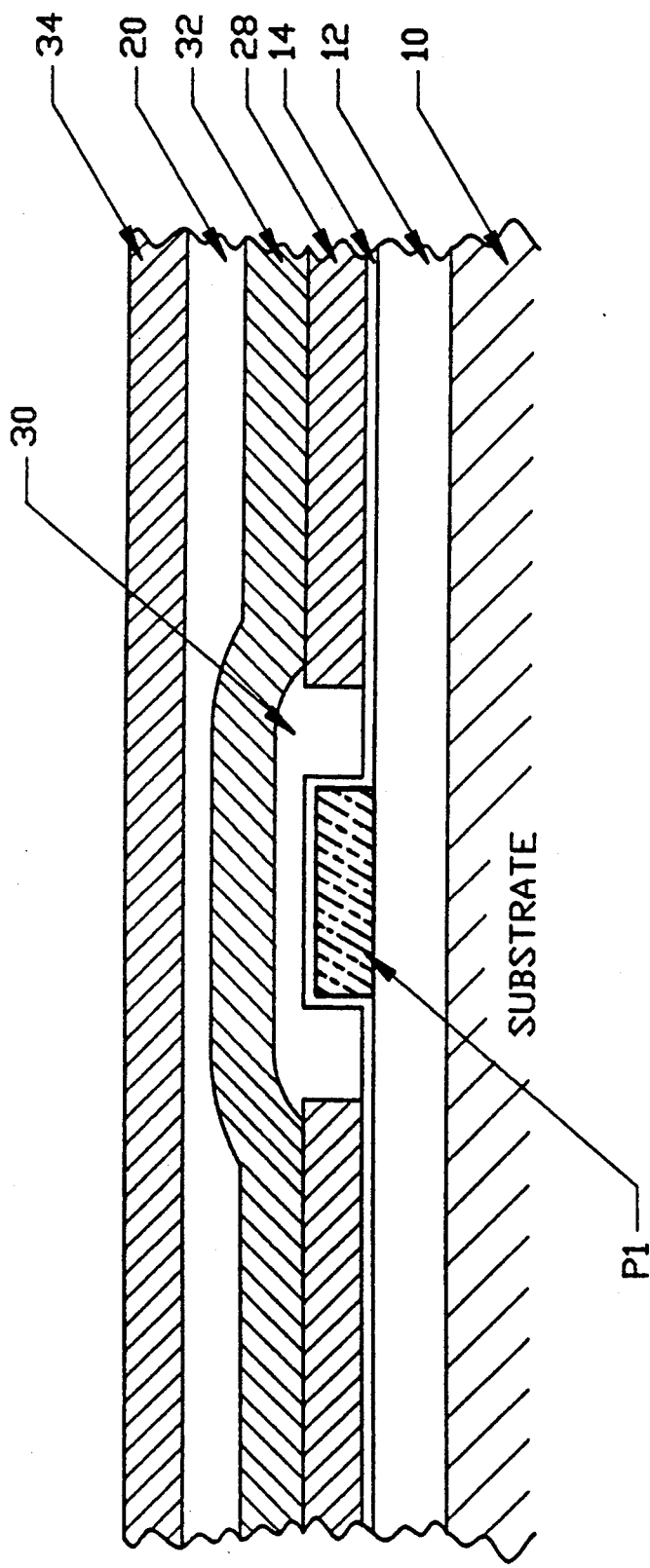
FIG. 6 is a partial cross-sectional view showing the first planar layer or leg of the second coil structure.
Figure 7:
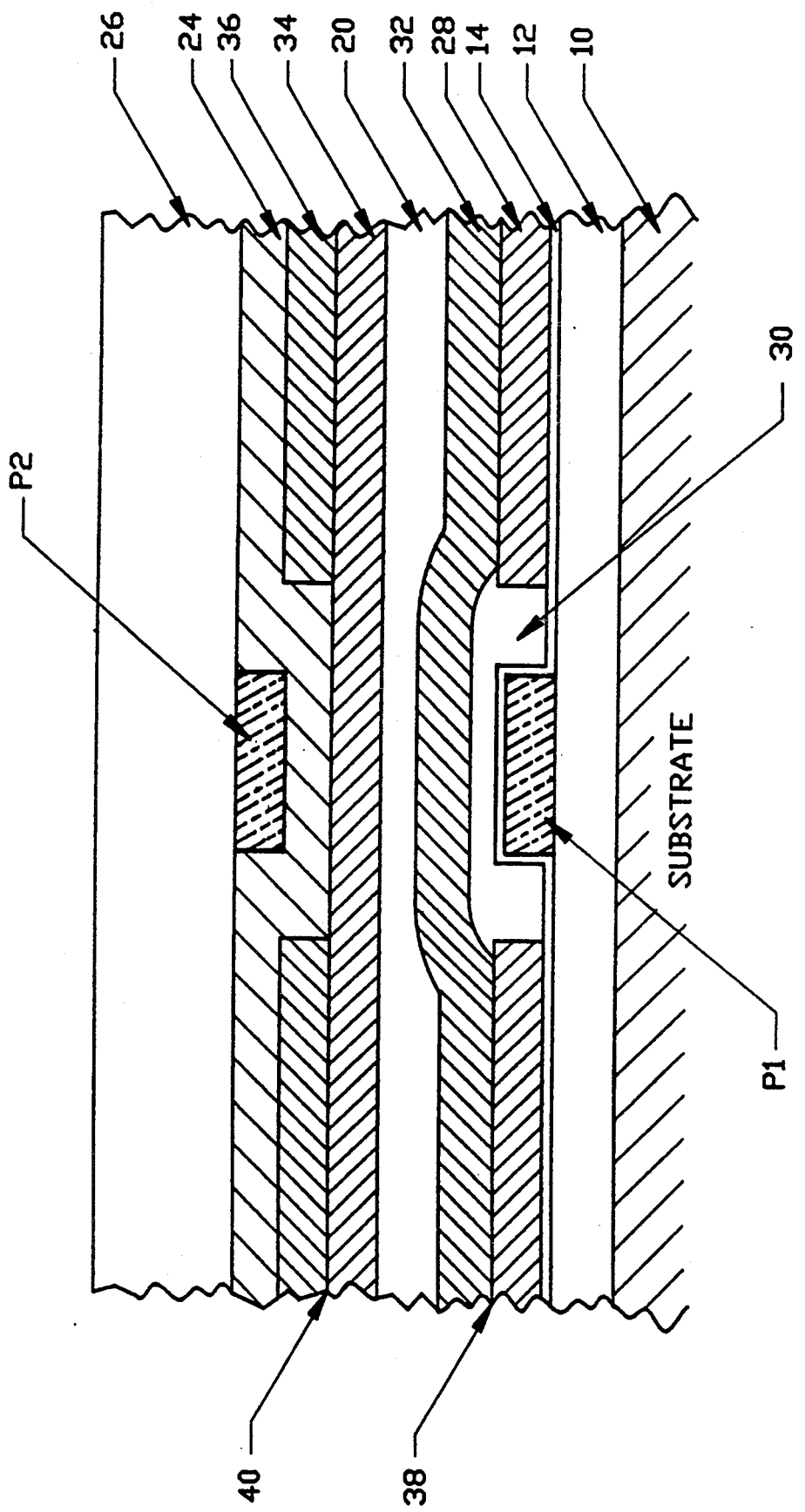
FIG. 7 is a partial cross-sectional view of a thin film head assembly incorporating the partly thickened coil structures, in accordance with this invention.

In keeping with this invention and as shown in FIGS. 2 and 7, the coil structures are each fabricated with two layers or legs. One leg of each coil structure is formed with a conventional thin layer and the second leg is formed to provide a much thicker layer of a portion of the coil structures. The thicker portion is located away from the P1 and P2 pole pieces and outside of the magnetic region between the pole pieces. As illustrated in FIG. 3, the first leg 28 of the coil structure 38 is deposited by well known masking, sputtering, plating and etching processes over the insulating gap layer 14 to form a step segment. Insulation layer 16 shown in FIGS. 1b and 2 is not depicted in FIGS. 3–7 for the purpose of convenience, as this layer 16 need not be used in some embodiments of the invention. The leg 28 is spaced from the P1 pole piece so that no portion of the leg 28 is disposed within the region of magnetic flux developed between P1 and P2. After deposition of the first coil leg 28, the upper second layer or leg 32 of the first coil structure 38 is deposited over the first leg 28 and additionally over the portion of the insulation 30 formed above the P1 pole piece, as shown in FIG. 4.

Figure 5:
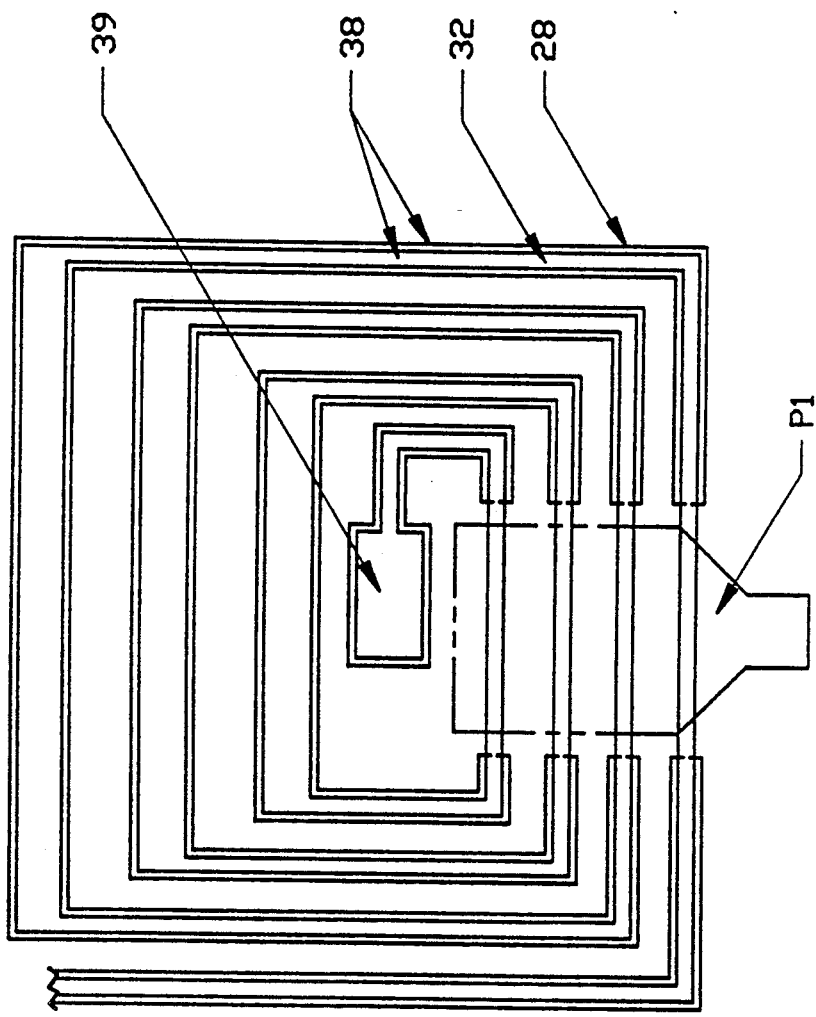
FIG. 5 is a plan view of the first and second legs of the first coil structure relative to the pole pieces of which P1 is shown.

FIG. 5 represents the first coil structure 38 with both layers of coils 28 and 32 connected at the interconnect pad 39.

The thickness of the inner structure of upper second layer 32 of the first coil structure 38, disposed within the magnetic region of the transducer between the pole pieces, is relatively thin, in the range of about 2.5 to 4.0 microns, for example; and the thickness of the lower layer 28 of the first coil 38 outside the magnetic region, where the step segment 28 is provided, is made as thick as possible within manufacturing constraints. At present these manufacturing limitations allow the thickness of the layer 28 to be about the same as the thickness of the layer 32, which results in an overall thickness of the coil 38 of about twice the thickness of the layer 32, or about 5 to 8 microns thick. The second leg 32 of the first coil 38 is preferably made slightly narrower than the first leg 28 to facilitate coil-to-coil alignment.

After having completed the first coil assembly 38 with its two legs 28 and 32, an organic insulation layer 20 is deposited over the second leg 32. The layer 20 provides leveling for facilitating the deposition of the first layer or leg 34 of the second coil structure 40, as shown in FIG. 6. The first leg 34 is substantially planar and is about the same thickness as the second leg 32 of the first coil 38. As illustrated in FIG. 7, a second coil leg 36 is deposited on the leg 34 by a remask step, similar to the process step used for the first leg 28 of the first coil 38. The second leg 36 is thickened approximately to the level of the second pole P2. The leg 36 has a thickness substantially the same as the first leg 28 of the first coil 38.

The coil structures 38 and 40 have configurations which are virtual mirror images of each other.

An organic insulation layer 24 is next formed over the second leg 36 and the P2 pole piece is formed on the baked photoresist layer 24. A thick aluminum oxide insulation layer 26 is then deposited to serve as an overcoat and protective layer for the thin film magnetic head.

In the head assembly disclosed herein, the coils 38 and 40 are electrically connected to complete the signal circuit path. The other ends of the coils 38 and 40 are connected to pins or terminals which are coupled to external circuitry for passing signals through the head during recording and readout. In the particular embodiment described, the windings or turns of the coil structure 38 are made with a 5 micron pitch comprising 4 micron lines with a 1 micron spacing. The distance between the P1 pole piece and the bottom surface of the second leg or layer 32 of coil 38 was made to be about 2 to 5 microns.

The insulation layers 16, 20, and 24 are made of organic material, i.e., a cured photoresist, which prevents the coils from electrical shorting to each other as well as to the pole pieces P1 and P2.

By virtue of the novel coil assembly incorporating coil structures having a plurality of coil layers, with one layer formed as a step adjacent to a thin coil layer to thicken the overall coil structure, a desirable reduction in coil resistance of a thin film head is realized. The step layer is made as thick as practically possible with present day manufacturing techniques, and is located out of the magnetic region defined by the opposing pole pieces.

It should be understood that the invention is not limited to the particular parameters, dimensions and design disclosed herein. For example, a single coil structure with a thin leg and a thick step leg may be produced to obtain a lowered coil resistance. Also the thicknesses of the coil layer may be varied to accommodate a specific configuration of a thin film head assembly. Also the step segment layer may be much thicker than the thin layer with the portion of the coil structure having the additional thickness outside of the magnetic yoke area thereby effectively decreasing coil resistance.

I claim:

1. A thin film head assembly comprising:
   a substrate;
   first and second spaced magnetic pole pieces defining a magnetic yoke region supported by said substrate;
   spaced first and second coil structures disposed between said pole pieces, each coil structure having a first thin leg and a second thicker leg formed adjacent to and in contact with said first thin leg;
   said first leg of each coil structure being substantially planar and extending across and beyond said magnetic yoke region;
   a step segment formed in said second thicker leg of each coil structure, said step segment being located away from and spaced from said pole pieces and said magnetic yoke region.

2. A thin film head assembly as in claim 1, including insulation layers disposed between said pole pieces and said coil structures.

3. A thin film head assembly as in claim 1, wherein said first and second coil legs of each of said coil structures are in contact with to each other.

4. A thin film head assembly as in claim 1, wherein said first and second coil structures are electrically connected, and include terminals for connection to external circuitry.

5. A thin film head assembly as in claim 1, wherein said first thin leg has a thickness in the range of about 2.5 to 4.0 microns.

6. A thin film head assembly as in claim 1, wherein said step segment of said second leg has a thickness substantially the same as said first thin leg, so that said first and second coil structures each have a thickness substantially twice that of said first thin leg.

7. A thin film head assembly as in claim 6, wherein said thickness of each of said coil structures is about 5 to 8 microns.

8. A thin film head assembly as in claim 1, wherein said first and second coil structures are formed as virtual mirror images of each other.

* * * * *